US006486698B2

(12) United States Patent
Yanagawa

(10) Patent No.: US 6,486,698 B2
(45) Date of Patent: Nov. 26, 2002

(54) LSI DEVICE CAPABLE OF ADJUSTING THE OUTPUT IMPEDANCE TO MATCH THE CHARACTERISTIC IMPEDANCE

(75) Inventor: Miki Yanagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/759,160

(22) Filed: Jan. 16, 2001

(65) Prior Publication Data

US 2001/0015882 A1 Aug. 23, 2001

(30) Foreign Application Priority Data

Jan. 31, 2000 (JP) ........................................ 2000-021006

(51) Int. Cl.[7] ............................ H03K 17/16; H03L 5/00
(52) U.S. Cl. ............................ 326/30; 326/86; 327/112; 327/316
(58) Field of Search ............................ 326/30, 83, 86, 326/87, 21; 327/316, 108, 112; 710/101

(56) References Cited

U.S. PATENT DOCUMENTS 5,134,311 A * 7/1992 Biber et al. .................. 307/270
5,254,883 A   10/1993 Horowitz et al.
5,621,335 A * 4/1997 Andresen ..................... 326/30

FOREIGN PATENT DOCUMENTS

| JP | A 11-17518 | 1/1999 |
| JP | A 11-27132 | 1/1999 |

* cited by examiner

Primary Examiner—Daniel D. Chang
(74) Attorney, Agent, or Firm—Arent Fox Kintner Plotkin & Kahn, PLLC

(57) ABSTRACT

According to an aspect of the present invention there is provided an LSI device having an output terminal outputting a data, comprising a data output circuit connected to the output terminal and capable of adjusting an output impedance thereof; and an adjustment circuit which detects a transient voltage at the output terminal when an output logic of the data output circuit is switched in a condition that a transmission line not terminated by a terminating resistor is connected to the output terminal, compares the transient voltage with a reference voltage, and adjusts the output impedance of the data output circuit so as to match a characteristic impedance of the transmission line. According to the present invention, as the transient voltage of the output terminal connected to the transmission line is detected, and the output impedance of the data output circuit is adjusted, it is possible to adjust so that output impedance of the data output circuit is matched with characteristic impedance of the transmission line even if manufacture processes, use temperatures, power supply voltages, characteristic impedance of the transmission line, or the like fluctuates or is changed.

8 Claims, 12 Drawing Sheets

FIG. 9 Timing Chart of Adjustment Timing Generation Part 200

LSI DEVICE CAPABLE OF ADJUSTING THE OUTPUT IMPEDANCE TO MATCH THE CHARACTERISTIC IMPEDANCE

BACKGROUND OF THE INVENTION

1. Field of the Invention

The present invention relates generally to an LSI device, and more particularly, to an LSI device capable of adjusting the output impedance so as to match the characteristic impedance of a transmission line irrespective of the variance of use environments such as temperatures and power supply voltages.

2. Description of the Related Arts

The LSI device outputs a processed signal from a data output circuit in the LSI device to a transmission line. In this case, it is desirable that output impedance of the data output circuit is matched with characteristic impedance of the transmission line. This is because, if the data output circuit is matched with the impedance of the transmission line, a reflection of a signal at a connection point of the both disappears, and it is possible to prevent damping of the signal to be transmitted to the transmission line.

For this reason, in the conventional LSI device, a simulation of the connection of the data output circuit with the transmission line is made to determine an output transistor size of the data output circuit, or the data output circuit is connected actually with the transmission line to observe a signal waveform, and the transistor size of the data output circuit is trimmed, so that the output impedance is matched to the characteristic impedance of the transmission line.

However, if the output transistor size of the data output circuit is fixed by trimming, when a manufacture process fluctuates, or when fluctuations such as temperatures, power supply voltages, characteristic impedance of the transmission line, or the like generate in the case where the LSI device is used, the output impedance of the data output circuit is not matched with the characteristic impedance of the transmission line.

Furthermore, after the LSI device is manufactured, in the case where a user's use conditions in use temperatures, power supply voltages, characteristic impedance of the transmission line, or the like are changed, it is impossible to agree the output impedance with the user's use conditions by changing the output transistor size of the data output circuit.

SUMMARY OF THE INVENTION

It is therefore the an object of the present invention to provide an LSI device which can be adjusted so that output impedance of a data output circuit is matched with characteristic impedance of a transmission line even if manufacture processes, use temperatures, power supply voltages, characteristic impedance of the transmission line, or the like fluctuates or is changed.

In order to achieve the above object, according to an aspect of the present invention there is provided an LSI device having an output terminal outputting a data, comprising a data output circuit connected to the output terminal and capable of adjusting an output impedance thereof; and an adjustment circuit which detects a transient voltage at the output terminal when an output logic of the data output circuit is switched in a condition that a transmission line not terminated by a terminating resistor is connected to the output terminal, compares the transient voltage with a reference voltage, and adjusts the output impedance of the data output circuit so as to match a characteristic impedance of the transmission line.

According to the present invention, as the transient voltage of the output terminal connected to the transmission line is detected, and the output impedance of the data output circuit is adjusted, it is possible to adjust so that output impedance of the data output circuit is matched with characteristic impedance of the transmission line even if manufacture processes, use temperatures, power supply voltages, characteristic impedance of the transmission line, or the like fluctuates or is changed.

In order to achieve the above object, according to another aspect of the present invention there is provided an LSI device having an output terminal outputting a data, a dummy output terminal outputting a dummy data, and a dummy input terminal which accepts the dummy data through a dummy transmission line, the LSI device comprising a data output circuit connected to the output terminal and capable of adjusting an output impedance thereof; a dummy output circuit connected to the dummy output terminal and having a configuration equivalent to that of the data output circuit; and an adjustment circuit which detects a transient voltage at the dummy output terminal when an output logic of the dummy data output circuit is switched in a condition that a dummy transmission line is connected between the dummy output terminal and the dummy input terminal, compares the transient voltage with a reference voltage, and adjusts the output impedance of the data output circuit and of the dummy output circuit so as to match a characteristic impedance of the dummy transmission line.

According to the present invention, as the transient voltage of the dummy output terminal connected to the dummy transmission line is detected to adjust the output impedance of the dummy output circuit and data output circuit, even if manufacture processes, use temperatures, power supply voltages, characteristic impedance of the transmission line, or the like fluctuates or is changed, the output impedance of the data output circuit can be adjusted so as to match the characteristic impedance of the transmission line.

Preferably, the transient voltage is detected at the timing when a logic of a signal fed to the dummy input terminal is switched, and the transient voltage is a voltage substantially intermediate of the amplitude of the signal.

According to the present invention, as the transient voltage can be detected at the timing that the logic of the signal to be input into the dummy input terminal is switched, it is possible to readily detect a substantially intermediate voltage of the signal amplitude.

BRIEF DESCRIPTION OF THE DRAWINGS

The above and other objects, aspects, features and advantages will become more apparent from the following detailed description when read in conjunction with the accompanying drawings, in which.

DESCRIPTION OF THE PREFERRED EMBODIMENTS

Presently preferred embodiments of the present invention will now be described with reference to the accompanying drawings. However, such embodiments limit by no means a technical scope of the present invention.

An LSI device in accordance with a first embodiment of the present invention, in the case where a transmission line having no terminal resistor is connected to a data output circuit, adjusts the output impedance of the data output circuit depending on a signal waveform level at the connection point between the data output circuit and the transmission line.

Figure 1:
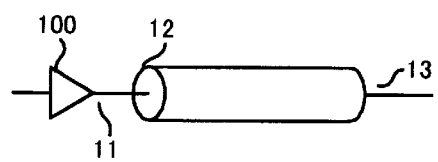
FIG. 1 shows the connection of a transmission line and a data output circuit.

Then, as shown in FIG. 1, a data output circuit 100 of the LSI device is connected to a transmission line 12 of which one end is an open end, and a transient phenomenon in the case where a signal is output from the data output circuit 100 to the transmission line 12 will be explained.

Figure 2A:
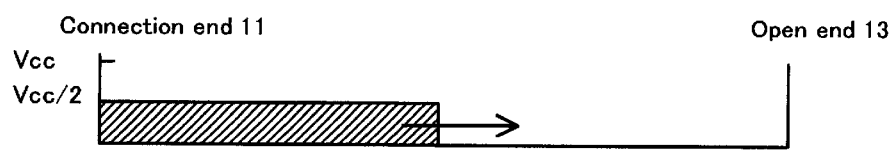
FIG. 2 is an illustrative diagram of-the waveform of a signal transmitted through the transmission line.

FIG. 2 is a typical graph of the signal waveform transmitting in the transmission line 12 of which one end is the open end 13. In the case where a signal changing from an L level to an H level (Vcc) is output at time t=0 from the data output circuit 100, the signal advances from a connection end 11 towards an open end 13 in the transmission line 12 as shown in FIG. 2A. In this case, this signal waveform has a magnitude of about Vcc/2 in which a voltage of the H level of the signal is divided by output impedance of the data output circuit 100 and characteristic impedance of the transmission line 12.

Figure 2B:
Figure 2C:
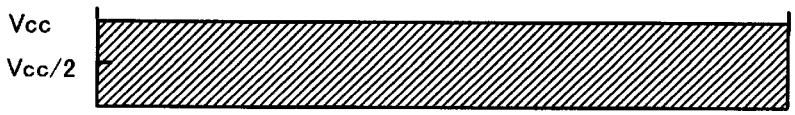

When the signal waves reach the open end 13, they are reflected thereby, as shown in FIG. 2B, they advance towards the connection end 11, and as shown in FIG. 2C they consequently arrives at the connection end 11. Time T from a drive of the transmission line 12 by the data output circuit 100 to an arrival of the reflected waves is determined by a length of the transmission line 12 and a material constituting the transmission line 12.

Figure 3:
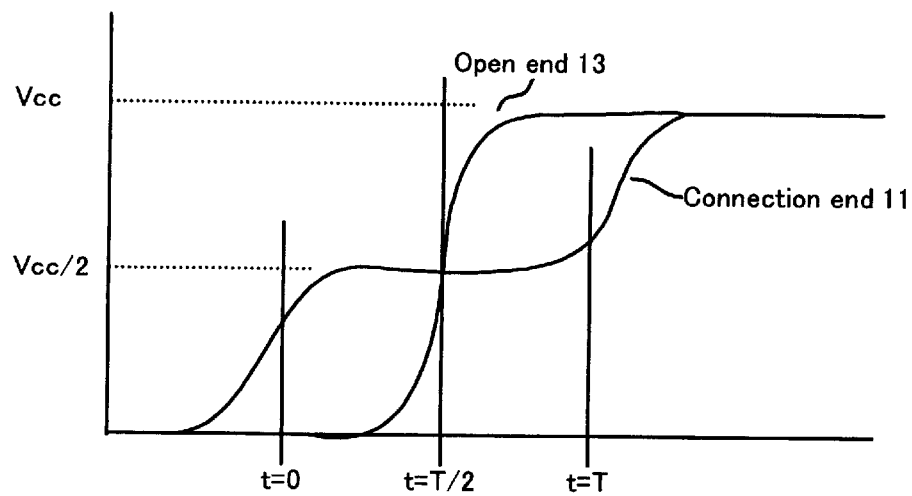
FIG. 3 shows a waveform to be observed.

FIG. 3 shows a signal waveform observed in this case, in which a thick line denotes a signal waveform observed at the connection end 11, and a thin line is a signal waveform observed at the open end 13. Namely, at the connection end 11, during a period from time t=0 when a signal is output to time t=T when reflected waves are returned, a voltage of about Vcc/2 is observed, and a voltage of Vcc after the time t=T is observed. On the other hand, at the open end 13, a voltage of Vcc is observed at time t=T/2 when the signal arrives.

In this manner, the observed voltage at the connection end 11 while the data output circuit 100 drives the transmission line 12, and the reflected waves return is the one, Vcc/2, obtained by dividing the power supply voltage Vcc by the output impedance of the data output circuit 100 and the characteristic impedance of the transmission line 12.

Figure 4:
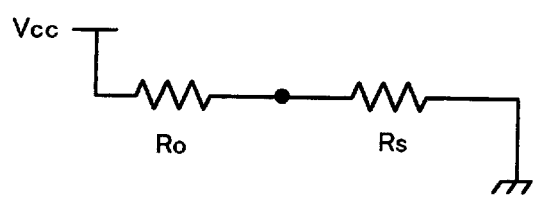
FIG. 4 shows an equivalent circuit in which a signal wave is transmitted through the transmission line.

For this reason, in a transmission system in a state that the data output circuit 100 drives the transmission line 12, and signal waves advance in the transmission line 12, assuming that the output impedance of the data output circuit 100 is pure resistance, it can be represented as an equivalent circuit of FIG. 4.

Namely, when output impedance $R_0$ of the data output circuit 100 agrees with characteristic impedance Rs of the transmission line 12, a voltage to be observed at the connection end 11 becomes half the power supply voltage Vcc. On the other hand, in the case where the output impedance $R_0$ is smaller than the characteristic impedance Rs, when the data output circuit 100 outputs an H level, a voltage to be observed is greater than Vcc/2, and when the data output circuit 100 outputs an L level, a voltage to be observed is smaller than Vcc/2. In the case where the output impedance $R_0$ is greater than the characteristic impedance Rs, the result is reversed thereto.

Accordingly, the observing voltage is compared with a reference voltage of Vcc/2, whereby a relationship between the output impedance $R_0$ of the data output circuit 100 and the characteristic impedance Rs of the transmission line 12 is conjectured, and both of the impedances can be matched with each other.

Figure 5:
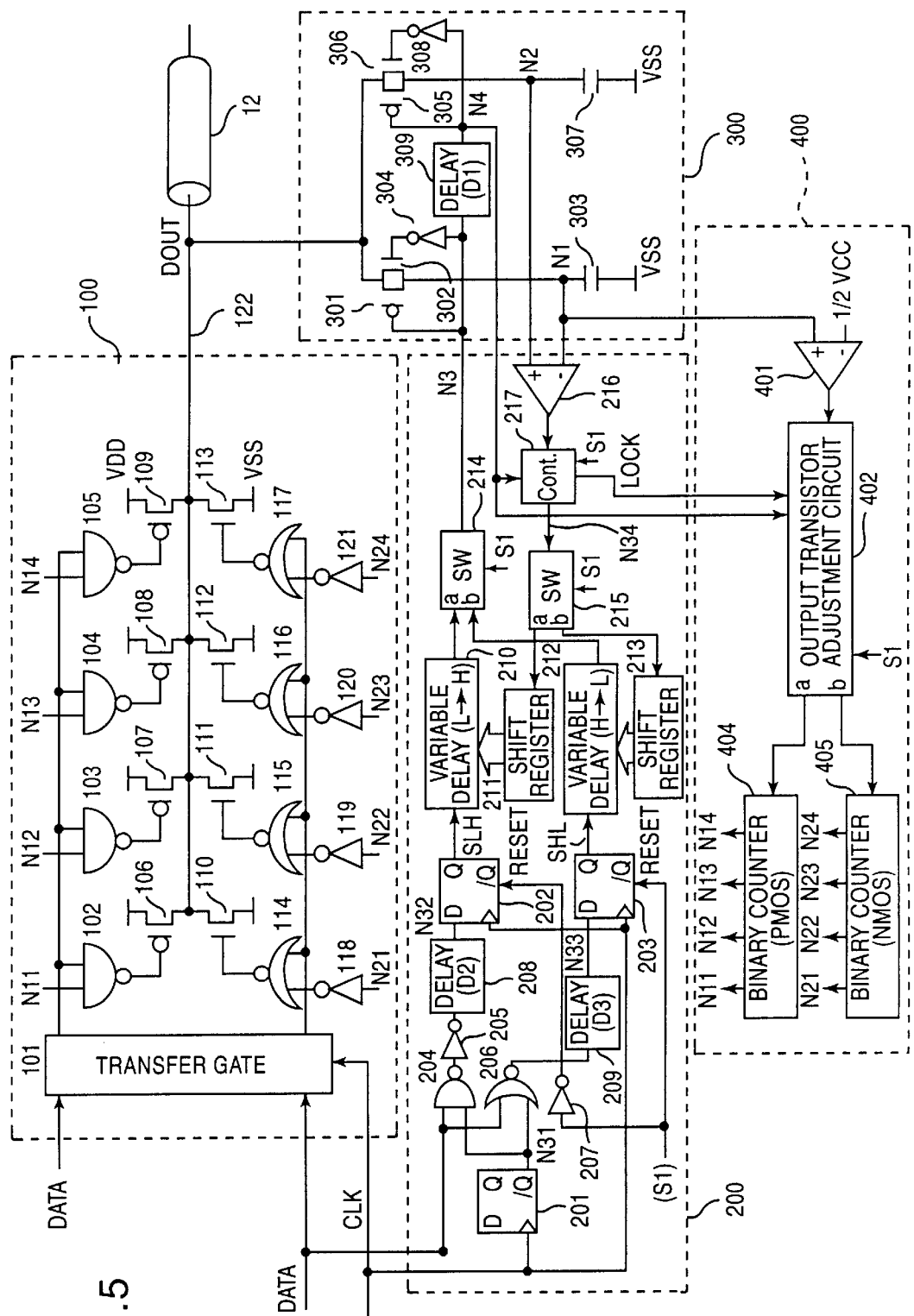
FIG. 5 shows the configuration of an LSI device according to a first embodiment of the present invention.

FIG. 5 is a configuration diagram of the LSI device according to the first embodiment of the present invention. The LSI device according to the first embodiment adjusts the output impedance of the data output circuit 100 by use of the data output circuit 100 in the LST device and the transmission line 12 not connecting with a terminal resistor.

The LSI device according to the first embodiment is configured by the data output circuit 100, an adjustment timing generation part 200, a sampling part 300, and an output impedance adjustment part 400. Furthermore, the data output circuit 100 is connected to the transmission line 12 not connecting with the terminating resistor, and a voltage of an output end 122 is sampled by the sampling part 300.

The data output circuit 100 comprises a transfer gate 101 for transferring an input signal DATA in synchronism with a data output clock CLK, PMOS transistors 106, 107, 108, 109 connected in parallel to between a power supply VDD and the output end 122, NMOS transistors 110, 111, 112, 113 connected in parallel to between the output end 122 and a power supply Vss, NAND gates 102, 103, 104, 105 for selecting the PMOS transistors which are activated by an input of adjustment signals N11, N12, N13, N14 from the output impedance adjustment part 400, and NOR gates 114, 115, 116, 117 for selecting the NMOS transistors which are activated by an input of adjustment signals N21, N22, N23, N24 inverted by inverters 118, 119, 120, 121.

In the PMOS transistors 106, 107, 108, 109 and the NMOS transistors 110, 111, 112, 113, drive capability is weighted, and according to which transistor the adjustment signals N11 to N14, and N21 to N24 select, the output impedance of the data output circuit 100 is adjusted.

The adjustment timing generation part 200 delays sequentially the adjustment timing signal N3, and outputs it to the sampling part 300, and detects timing t=T/2 in an intermediate step part of a connection end waveform shown in FIG. 3.

The adjustment timing generation part 200 comprises flip-flops 201, 202, 203, a NAND circuit 204, a NOR circuit 206, inverters 205, 207, and delay circuits 208, 209. And in the case where an adjustment mode selection signal Si is in an H level, the flip-flop 202 becomes in an active state, and generates a signal SLH as a reference of an adjustment timing in the case where an output signal DOUT of the data output circuit 100 changes from the L level to the H level. On the other hand, in the case where the adjustment mode selection signal S1 is in an L level, the flip-flop 203 becomes in an active state, and generates a signal SHL as a reference of an adjustment timing in the case where the output signal DOUT of the data output circuit 100 changes from the H level to the L level.

The adjustment mode selection signal S1 is a signal for selecting a mode of adjusting the PMOS transistor of the data output circuit 100 and a mode of adjusting the NMOS transistor thereof. In the case where the adjustment mode selection signal S1 is in the H level, the PMOS transistor is adjusted, and in the case where the adjustment mode selection signal S1 is in the L level, the NMOS transistor is adjusted Furthermore, the adjustment timing generation part 200 comprises a variable delay circuit 210 and a shift register 211 for delaying the signal SLH to generate the adjustment timing signal N3, a variable delay circuit 212 and a shift register 213 for delaying the signal SHL to generate the adjustment timing signal N3, and switch circuits 214, 215 which are connected to "a" terminal in the case where the adjustment mode selection signal S1 is in the H level, and are connected to "b" terminal in the case where the adjustment mode selection signal S1 is in the L level.

Figure 6:
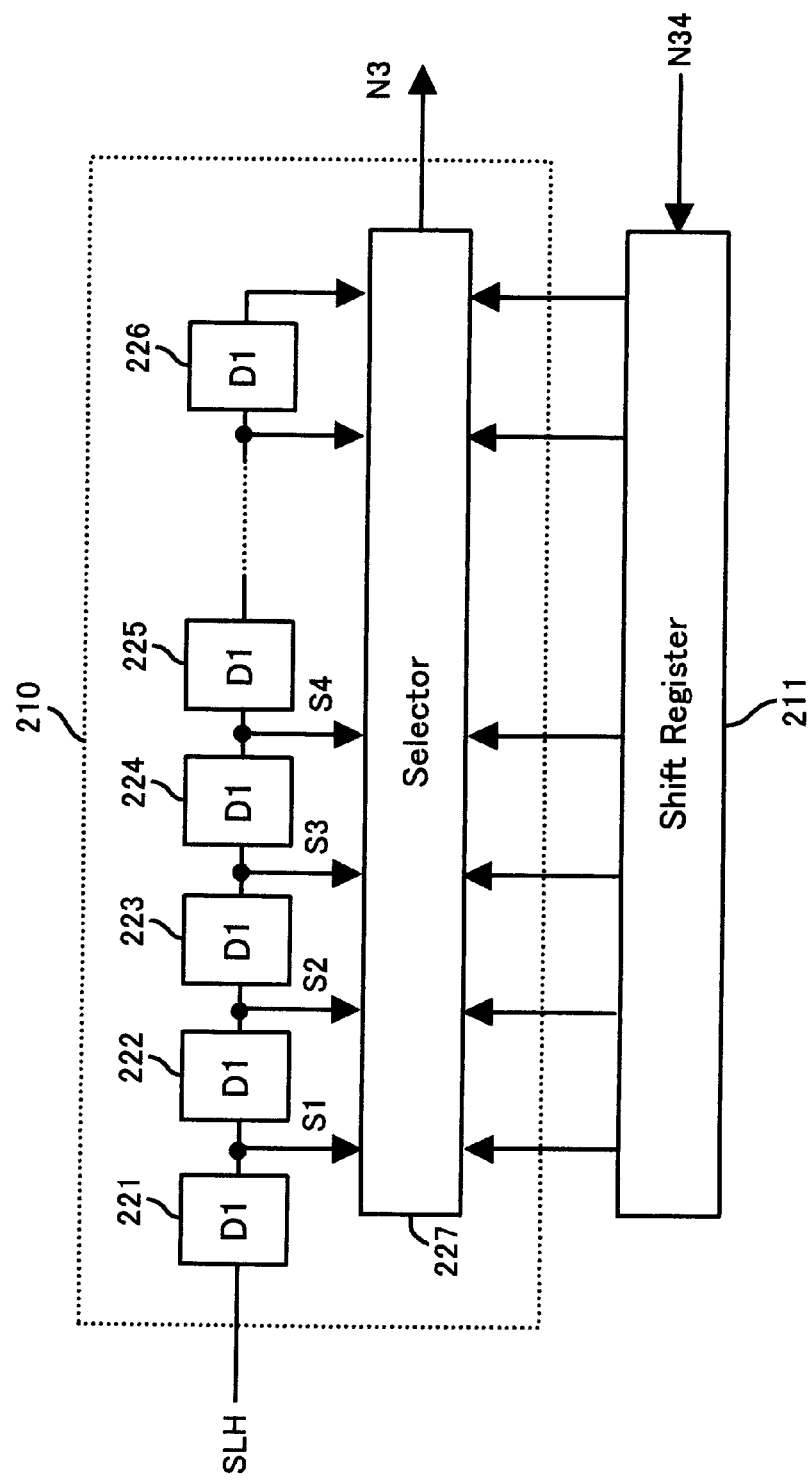
FIG. 6 shows the configuration of a variable delay circuit.

FIG. 6 is a configuration diagram of the variable delay circuit 210. The variable delay circuit 210 comprises delay elements 221, 222, 223, 224, 225, 226 having a delay time D1 serially-connected, and a selector 227 for selecting any one of signals S1, S2, S3, etc. at the connection signals of the delay elements 221 to 226. The signals SLH becomes the signals S1, S2, S3, etc. delayed by the delay time D1 by the delay elements 221 to 226 and are input into the selector 227. Any of the signals S1, S2, S3, etc. are selected according to an output of the shift register 211 in response to a control signal N34, and the adjustment timing signal N3 is output to the sampling part 300. Incidentally, the variable delay circuit 212 and the shift register 213 has the same configuration.

The adjustment timing generation part 200 further comprises a comparator 216 for comparing levels of two output signals DOUT sampled by the sampling part 300, and a control circuit 217 for outputting a control signal N34 shifting by one the shift register 211 or 213 in the case where the two output signals DOUT have a level difference, and for outputting a lock-on signal LOCK in the case where the two output signals DOUT have no level difference.

Figure 7:
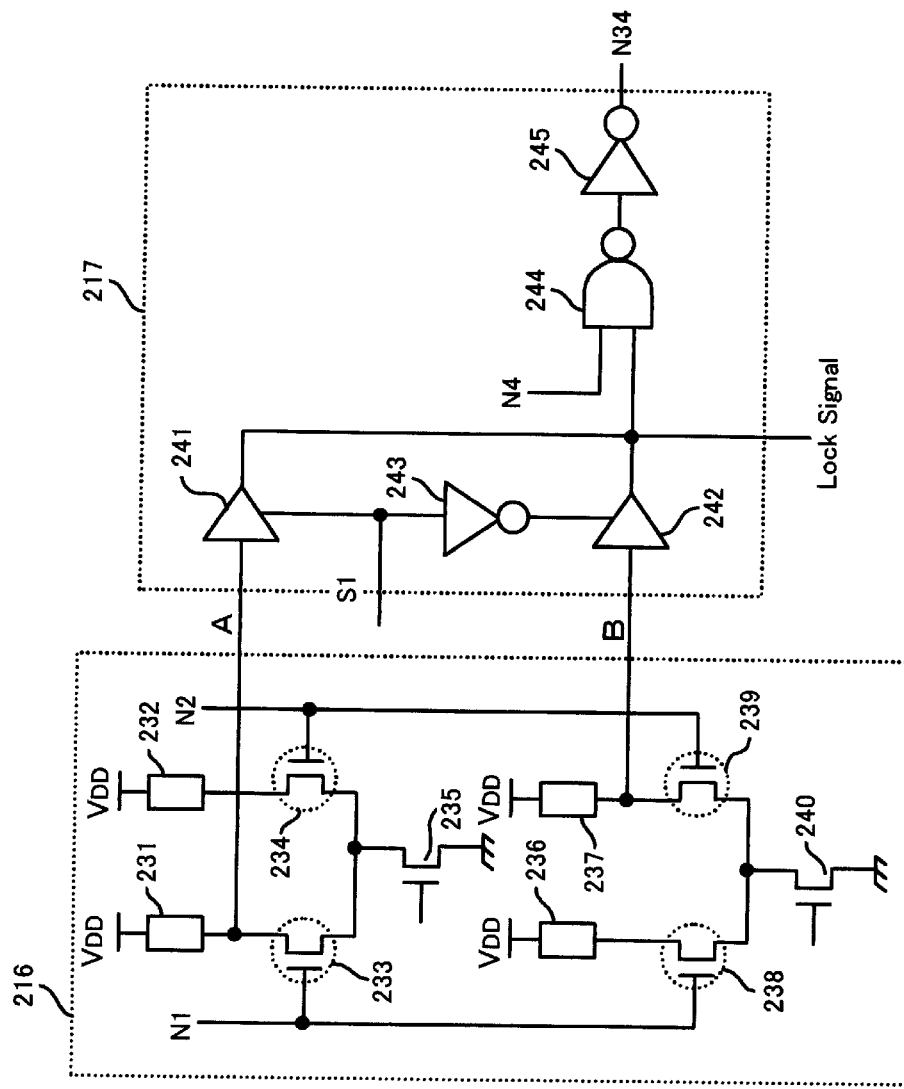
FIG. 7 shows the configuration of a comparator and a control circuit.

FIG. 7 is a configuration diagram of the comparator 216 and the control circuit 217. The comparator 216 is configured by two pairs of differential amplifier, and comprises NMOS transistors 233, 234, 238, 239 differentially connected into which sampling values N1, N2 of the output signal DOUT sampled by the sampling part 300 are input, load resistors 231, 232, 236, 237, and NMOS transistors 235, 240 configuring a current source.

Furthermore, the control circuit 217 comprises an inverter 243 for inverting the adjustment mode selection signal S1, buffers 241, 242 one of which becomes in an active state at a level of the adjustment mode selection signal S1 to output the lock-on signal LOCK, a NAND circuit 244 for passing the lock-on signal LOCK when the adjustment timing signal N4 to be input from the sampling part 300 is in the H level, and an inverter 245 for outputting a control signal N34. Incidentally, the adjustment timing signal N4 is a signal in which the adjustment timing signal N3 is delayed by time D1 by a delay circuit 309 of the sampling part 300.

As described above, in the case where the adjustment mode selection signal S1 is in the H level, this mode is one for adjusting the PMOS transistors 106 to 109 of the data output circuit 100, comparing the sampling values N1, N2 in the case where the output signal DOUT changes from the L level to the H level. As this case corresponds to a rising period of the output signal DOUT, the sampling value N2 to be sampled by the adjustment timing signal N4 is larger than the sampling value N1 to be sampled by the adjustment timing signal N3, and a comparison signal A becomes in the H level. As the buffer 241 is in the active state, the comparison signal A passes the buffer 241 to be the lock-on signal LOCK.

On the other hand, in the case where the adjustment mode selection signal S1 is in the L level, this mode is one for adjusting the NMOS transistors 110 to 113 of the data output circuit 100, comparing the sampling values N1, N2 in the case where the output signal DOUT changes from the H level to the L level. As this case corresponds to a falling period of the output signal DOUT, the sampling value N2 is smaller than the sampling value N1, and a comparison signal B becomes in the H level. As the buffer 242 is in the active state, the comparison signal B passes the buffer 242 to be the lock-on signal LOCK.

Out of the NMOS transistors 233, 234 differentially connected in the comparator 216, the NMOS transistor 233 is set to be larger in the drive capability than the NMOS transistor 234, and out of the NMOS transistors 238, 239 differentially connected, the NMOS transistor 239 is set to be larger in the drive capability than the NMOS transistor 238.

Accordingly, when a level difference between the sampling values N1 and N2 disappears, the NMOS transistor 233 or 239 having the large drive capability becomes conductive, and the comparison signal A or the comparison signal B becomes in the L level. Accordingly, the lock-on signal LOCK also becomes in the L level. Namely, when the adjustment timing signal N3 is sequentially delayed according to the control signal N34 and the intermediate step part of the output signal DOUT (N1=N2) is detected, the lock-on signal LOCK also becomes in the L level.

That is, in the control circuit 217, since the lock-on signal LOCK is in the H level until the level difference of the sampling values N1, N2 disappears, and the control signal N34 is in the H level while the adjustment timing signal N4 is in the H level, therefore the shift register 211 or 213 is shifted, so that a delay time of the variable delay circuit 210 or 212 is increased.

The sampling part 300 samples a level of the output signal DOUT at an adjacent slightly different timings, and comprises a PMOS transistor 301, an NMOS transistor 302, an inverter 304, and a sampling capacitor 303 for sampling the output signals DOUT when the adjustment timing signal N3 rises; a delay circuit 309 for giving a delay of a slight time D1 to the adjustment timing signal N3 and for generating the adjustment timing signal N4; and a PMOS transistor 305, an NMOS transistor 306, an inverter 308, and a sampling capacitor 307 for sampling the output signals DOUT when the adjustment timing signal N4 rises.

In the sampling capacitor 303, the sampling value N1 is sampled at a rising edge of the adjustment timing signal N3, and in the sampling capacitor 307, the sampling value N2 in rising of the adjustment timing signal N4 delayed by the delay time D1 from the adjustment timing signal N3 is sampled.

The output impedance control part 400 adjusts the output impedance of the data output circuit 100 according to the level of the intermediate step part of the output signal DOUT, and comprises a comparator 401 for comparing the sampling value N1 of the sampling part 300 with a reference voltage, ½ of the power supply voltage Vcc; an output transistor adjustment circuit 402 for outputting a count-up signal with respect to binary counters 404, 405 in correspondence with an output of the comparator 401; a binary counter 404 for generating the adjustment signals N11, N12, N13, N14 for set the PMOS transistors 106 to 109 of the data output circuit 100; and a binary counter 405 for generating the adjustment signals N21, N22, N23, N24 for set the PMOS transistors 110 to 113 of the data output circuit 100.

Figure 8:
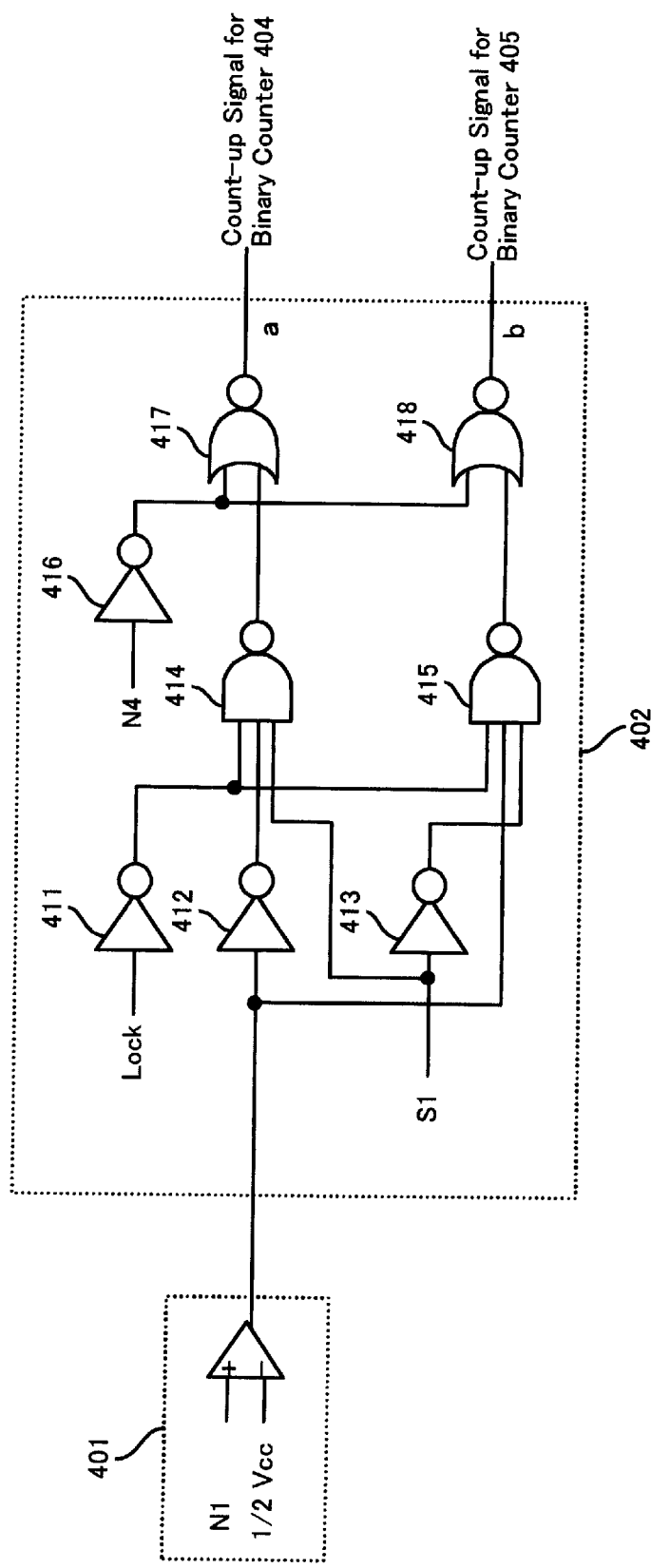
FIG. 8 shows the configuration of an output transistor adjusting circuit.

FIG. 8 is a configuration diagram of the output transistor adjustment circuit 402. The output transistor adjustment circuit 402 comprises inverters 411, 412, 413, 416, NAND circuits 414, 415, and NOR circuits 417, 418. In the output transistor adjustment circuit 402, when the adjustment timing generation part 200 detects the intermediate step part of the output signal DOUT, and the lock-on signal LOCK is set to be in the L level, the NAND circuits 414, 415 are opened to output a count-up signal.

The operation of the output impedance control part 400 will first be explained in the case where the PMOS transistors 106 to 109 of the data output circuit 100 are adjusted. In this case, the adjustment mode selection signal S1 is in the H level, and the comparator 401 compares the sampling value N1 of the intermediate step part of the output value DOUT with ½ Vcc. Here, in the case where the sampling value N1 is smaller than ½ Vcc, this is a case where impedance of the PMOS transistors 106 to 109 is large, and the output of the comparator 401 becomes in the L level. Since the H level obtained by inverting the output of the comparator 401 by the inverter 412 and the H level of the adjustment mode selection signal S1 are input into the NAND circuit 414, the output of NAND 414 becomes in the L level at the timing of the lock-on signal LOCK to be L level. For this reason, the output of the NOR circuit 417 becomes in the H level when the adjustment timing signal N4 becomes in the H level, generating the count-up signal a for the binary counter 404. Accordingly, in this case, a transistor size of the PMOS transistors 106 to 109 is increased via the binary counter 404 and the impedance of PMOS is lowered.

On the other hand, in the case where the NMOS transistors 110 to 113 of the data output circuit 100 are adjusted, the adjustment mode selection signal S1 is set to be in the L level. In this case, in the case where the sampling value N1 is greater than ½ Vcc, this is a case where impedance of the NMOS transistors 110 to 113 is large, and the output of the comparator 401 becomes in the H level. Since the H level of the output of the comparator 401 and the H level obtained by inverting the adjustment mode selection signal S1 by the inverter 413 are input into the NAND circuit 415, the output of NAND 415 becomes in the L level at the timing of the lock-on signal LOCK to be L level. For this reason, the output of the NOR circuit 418 becomes in the H level when the adjustment timing signal N4 becomes in the H level, generating the count-up signal b for the binary counter 405. Accordingly, in this case, a transistor size of the NMOS transistors 110 to 113 is increased and the impedance is lowered.

In this case, according to this embodiment, as the signal level of the intermediate step part as the transient voltage at the output end 122 connected to the transmission line 12 is detected to adjust output impedance of the data output circuit 100, even if manufacture processes, use temperatures, power supply voltages, characteristic impedance of the transmission line, or the like fluctuates or is changed, the output impedance of the data output circuit 100 can be adjusted so as to match the characteristic impedance of the transmission line 12.

Figure 9:
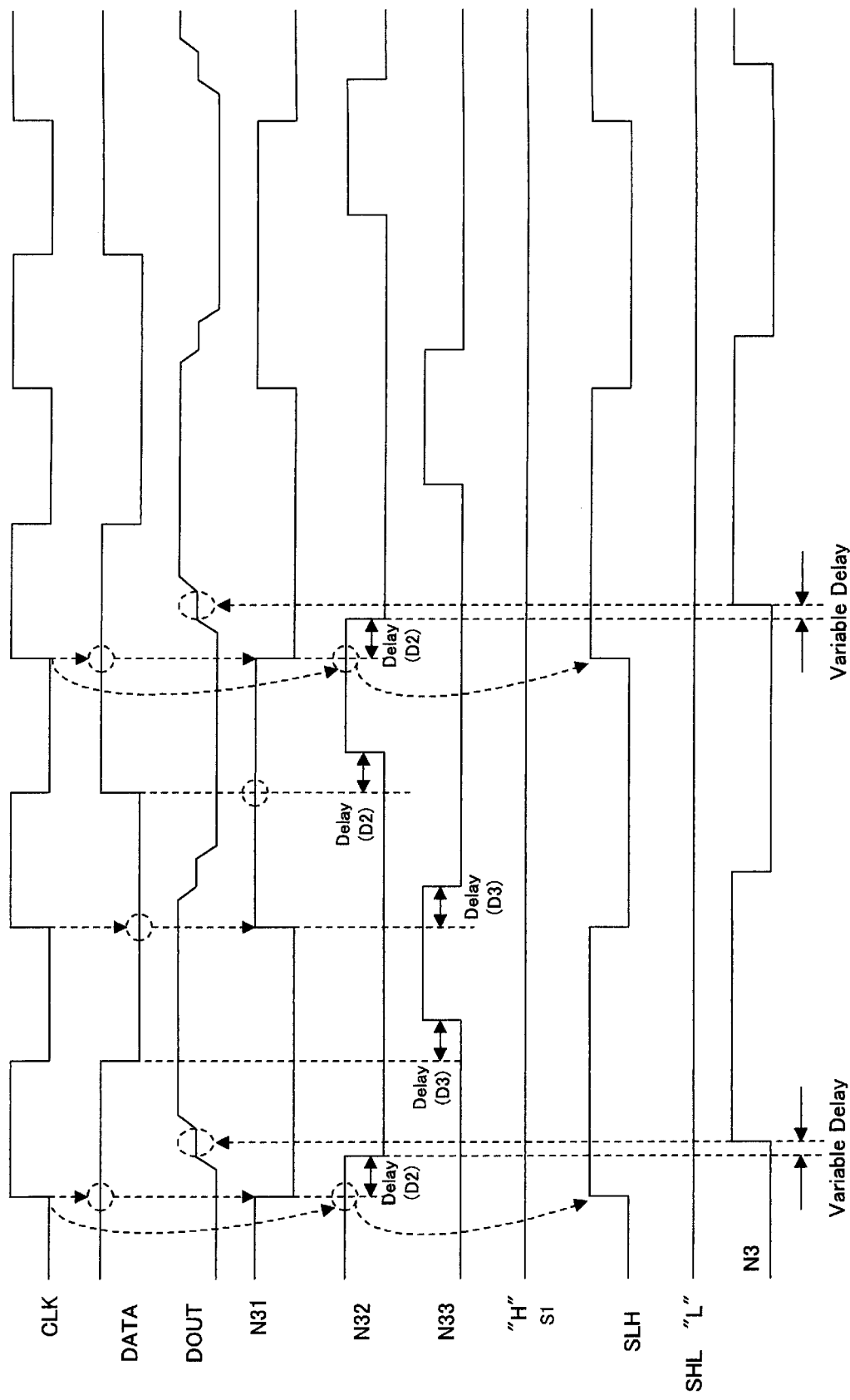
FIG. 9 shows the operation of an adjustment timing generation part.

FIG. 9 is an operational representation of the adjustment timing generation part 200. In FIG. 9, a generation timing of the adjustment timing signal N3 will be explained in the case where the adjustment mode selection signal S1 is in the level, and the output signal DOUT changes from the L level to the H level.

As input signals DATA are input into a D terminal of the flip-flop 201 of FIG. 5, the H level of the input signal DATA is latched at a rising edge of a data output clock CLK, and the signal N31 of a /Q terminal of the flip-flop 201 becomes in the L level. The signal N31 is input into the NAND circuit 204 together with the input signal DATA. The output of the NAND circuit 204 is inverted by the inverter 205, and further a delay of time D2 is given thereto by the delay circuit 208 to be the signal N32. On the other hand, the signal N31 is input into the NOR circuit 206 together with the input signal DATA, and a delay of time D3 is given to the output of the NOR circuit 206 by the delay circuit 209 to be a signal N33.

Since the H level of the adjustment mode selection signal S1 is inverted by the inverter 207, a reset terminal of the flip-flop 202 becomes in the L level, and the flip-flop 202 becomes in an active state. On the other hand, the flip-flop 203 is reset.

The signal N32 is input into the D terminal of the flip-flop 202, and the H level of the signal N32 is fetched in at the rising edge of the data output clock CLK, and the signal SLH as a reference of the adjustment timing becomes in the H level. On the other hand, as the flip-flop 203 is reset while S1=H, the output signal SHL of the flip-flop 203 is still in the L level. A delay time established in the shift register 211 is given to the signal SLH by the variable delay circuit 210 to become the adjustment timing signal N3. The adjustment timing signal N3 is sequentially delayed until the intermediate step part of the output signal DOUT is detected, as described above.

Figure 10:
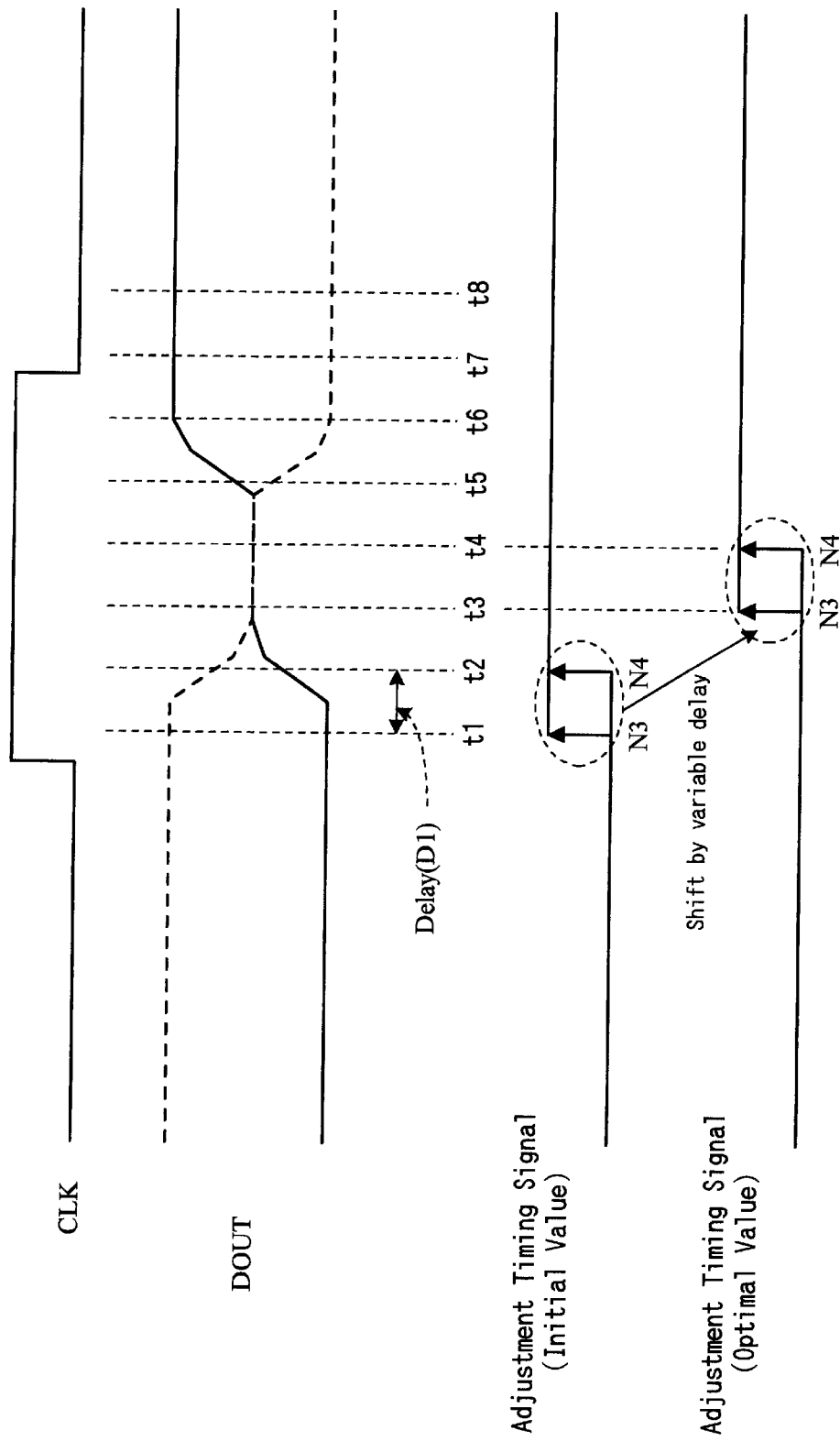
FIG. 10 shows the operation setting an adjustment timing.

FIG. 10 is an enlarged representation in the case where the output signal DOUT changes from the L level to the H level, and the operation of the sampling part 300 will be explained referring to FIG. 10. Incidentally, a dotted line is a case where the output signal DOUT changes from the H level to the L level. In the variable delay circuits 210, 212 of the adjustment timing generation part 200, the delay time is set at a minimum when the adjustment starts, and an initial value having the least delay in the adjustment timing signal N3 is supplied to the sampling part 300. A slight delay of the time D1 is given to the adjustment timing signal N3 by the delay circuit 309 of the sampling part 300 to generate the adjustment timing signal N4.

At the initial values of the adjustment timing signals N3, N4, the level of the output signal DOUT is sampled at timings of the times t1, t2 shown in FIG. 10 to generate the sampling values N1, N2. The sampling values N1, N2 are compared by the comparator 216 of the adjustment timing generation part 200. When it is detected by the comparator 216 that there is a difference in the sampling values N1, N2, the control circuit 217 generates the control signal N34 as described above, the shift register 211 or 213 is shifted by one, and the delay time of the variable delay circuit 210 or 212 is delayed by one delay element (the delay time D1), and the output signal DOUT is sampled again at the delayed timings N3 and N4. This sampling is repeated until a difference in levels of the sampling values N1, N2 disappears. In FIG. 10, a timing that the adjustment timing signal N3 is delayed until the time t3 is an optimal value.

When the adjustment timing signal N3 becomes the optimal value, as described above, the control circuit 217 generates the lock-on signal LOCK(=L level), and fixes the delay time of the variable delay circuit 210 or 212. Furthermore, the output impedance adjustment part 400 starts a count operation of the binary counters 404, 405 when receiving this lock-on signal LOCK, and starts an operation of adjusting the output impedance of the data output circuit 100.

Figure 11:
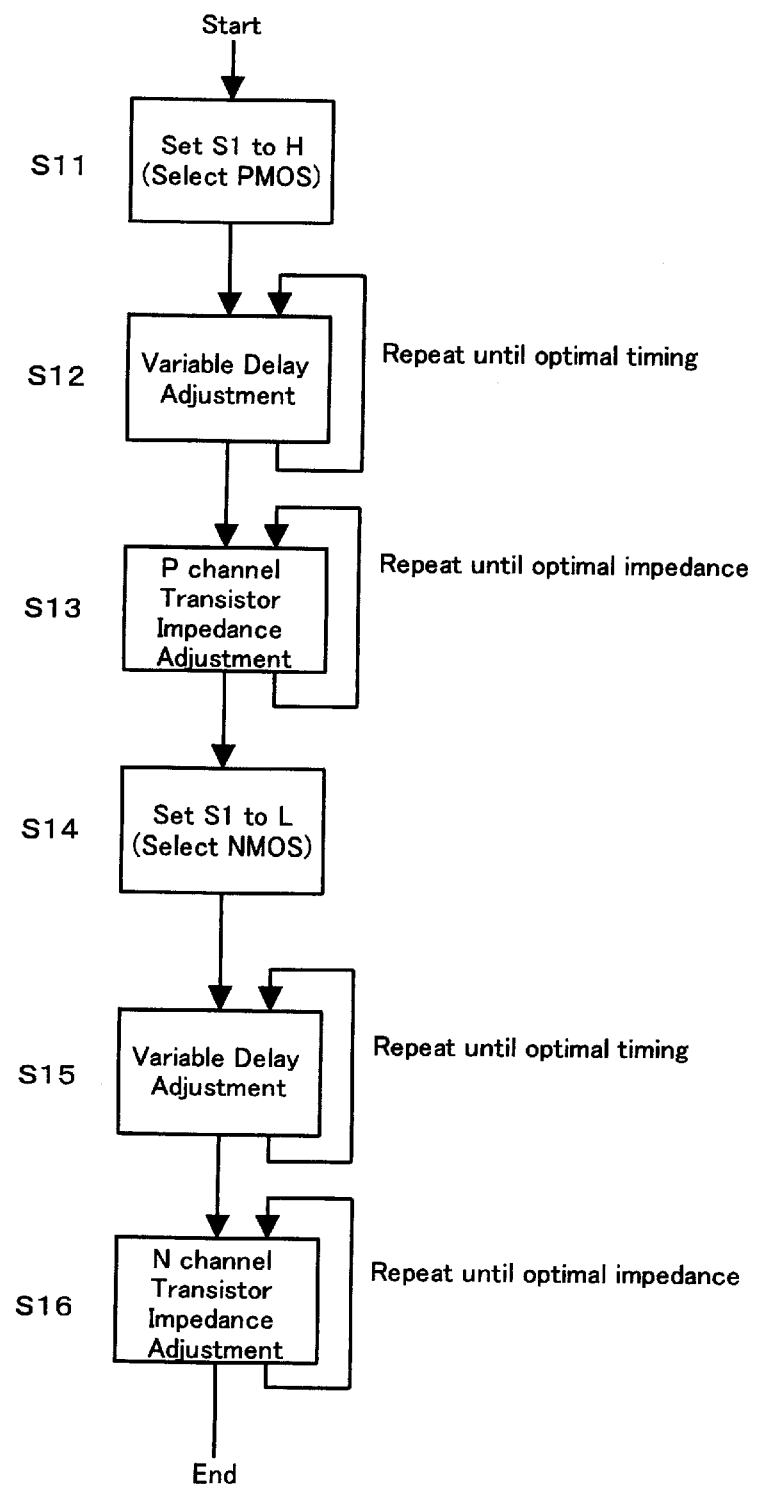
FIG. 11 shows the sequence of the output impedance adjustment.

FIG. 11 is a sequence diagram in the case where the output impedance is adjusted according to this embodiment. According to this embodiment, first, the adjustment mode selection signal S1 is set as the H level, thereby selecting a mode of adjusting the PMOS transistor of the data output circuit 100 (step S11).

Next, the delay time of the variable delay circuit 210 is adjusted, and the adjustment timing value N3 for measuring a level of the intermediate step part of the output signal DOUT is established (step S12). The level of the intermediate step part of the output signal DOUT is compared with ½ of the power supply voltage Vcc and the binary counter 404 is counted up. This adjustment operation is repeated until selecting the optimal PMOS transistor (step S13).

Then, the adjustment mode selection signal S1 is set to be in the L level, thereby selecting a mode of adjusting the NMOS transistor of the data output circuit 100 (step S14). Furthermore, the delay time of the variable delay circuit 212 is adjusted, and the adjustment timing signal N3 for measuring the level of the intermediate step part of the output signal DOUT is established (step S15). The level of the intermediate step part of the output signal DOUT is compared with ½ of the power supply voltage Vcc and the binary counter 405 is counted up. This adjustment operation is repeated until selecting the optimal NMOS transistor (step S16).

In this manner, as the LSI device according to this embodiment detects the signal level at the connection point between the data output circuit 100 and the transmission line 12, and adjusts the output impedance, even if use conditions such as temperatures, or the like changes, the output impedance can be adjusted so as to match the characteristic impedance of the transmission line 12.

Figure 12:
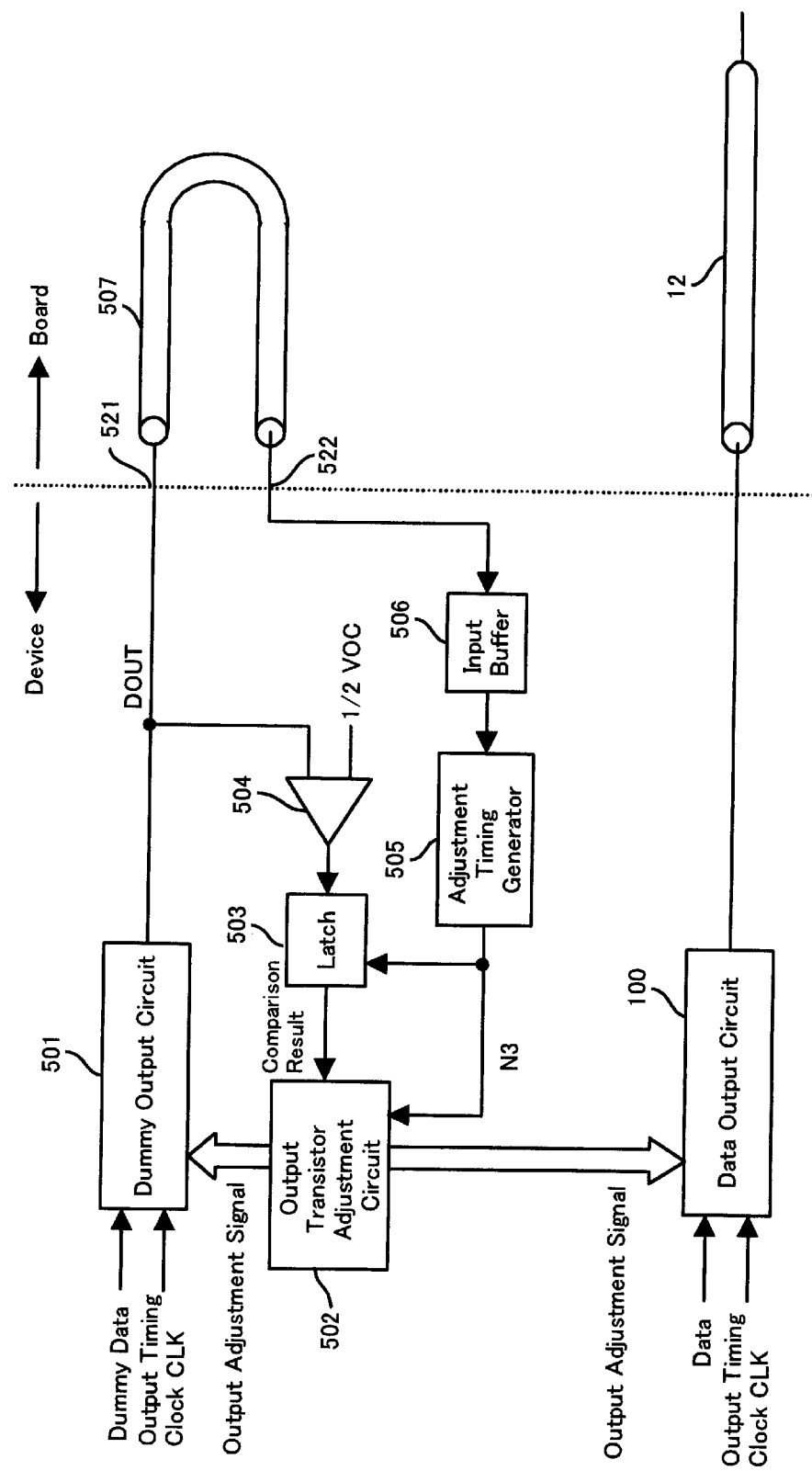
FIG. 12 shows the configuration of an LSI device according to a second embodiment of the present invention.

FIG. 12 is a configuration diagram of the LSI device according to a second embodiment of the present invention. The second embodiment uses a dummy output circuit 501 having a same configuration as the data output circuit 100 for use in the output of normal data, and a dummy transmission line 507 having an equivalent electric length to the using transmission line 12, thereby adjusting the output impedance of the dummy output circuit 501, and simultaneously adjusting the output impedance of the data output circuit 100.

According to the second embodiment, the dummy transmission line 507 is connected between an output end 521 of the dummy output circuit 501, and an input end 522 of an input buffer 506 having the larger input impedance than the characteristic impedance of the transmission line 12, and the output signal DOUT in the same manner as in the first embodiment is output from the dummy output circuit 501.

Figure 13:
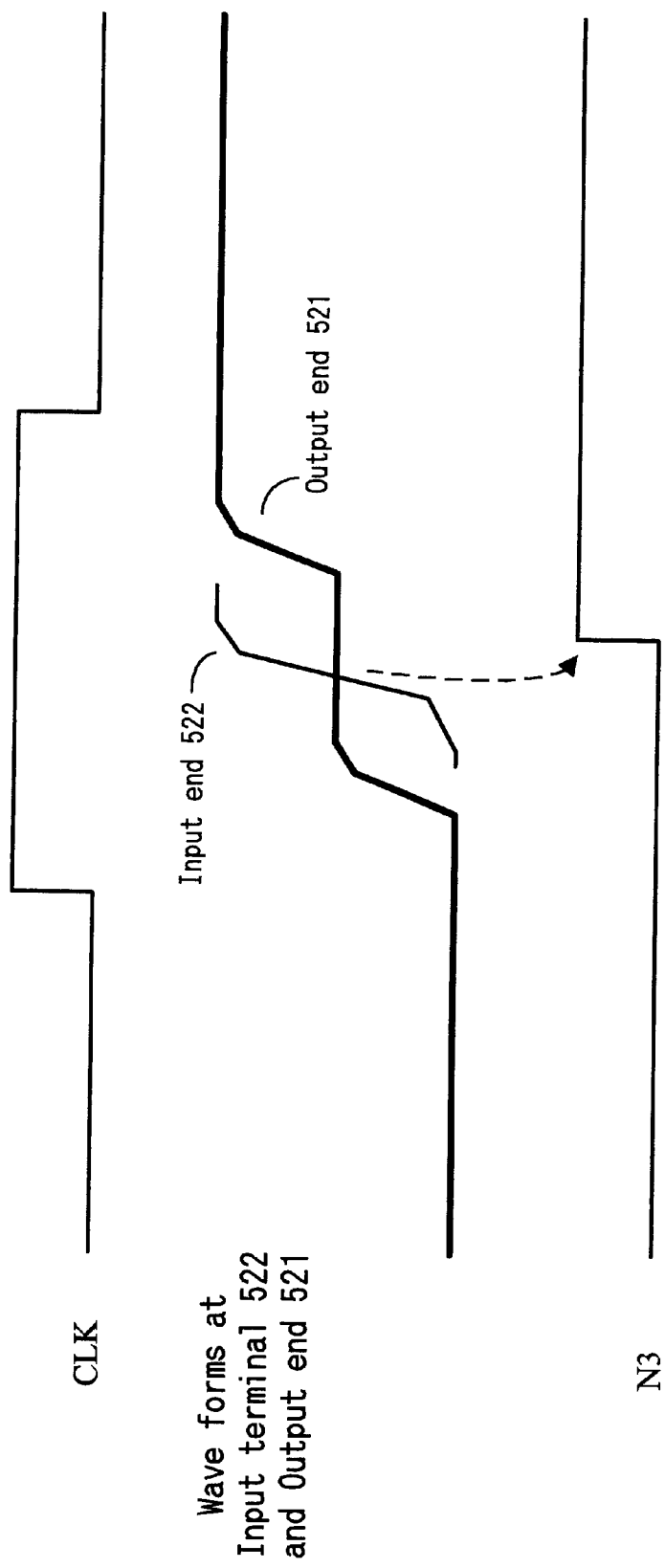
FIG. 13 shows the operation of the adjustment timing signal generation according to the second embodiment.

FIG. 13 is a timing chart of an adjustment timing generation according to this embodiment. A thick line is a signal waveform to be observed at the output end 521 of the dummy output circuit 501, and a slim line is a signal waveform to be observed at the input end 522 of the input buffer 506. As the input impedance of the input buffer 506 is larger than the characteristic impedance of the transmission line 507, the signal waveform to be observed at the input end 522 is the same as an open end waveform of the transmission line 12 shown in FIG. 3.

Accordingly, in an adjustment timing generation circuit 505, the signal waveform to be observed at the input end 522 of the input buffer 506 is only rectified, thereby generating the adjustment timing signal N3, and it is possible to more readily generate the adjustment timing signal N3 than in the first embodiment.

The output signal DOUT of the dummy output circuit 501 is compared with ½ Vcc by the comparator 504, and is held in a latch 503 by the adjustment timing signal N3. Namely, the compared results of the signal level of the intermediate step part of DOUT with ½ Vcc are held in the latch 503. The output transistor adjustment circuit 502 outputs the output adjustment signal to the dummy output circuit 501 and the data output circuit 100 corresponding to the compared results to adjust the output impedance of the circuits 100 and 501.

According to this embodiment, as the signal level of the intermediate step part can be detected at a timing that the logic of the signal input to the input end 522 is switched, it is possible to readily detect the signal level of the intermediate step part of DOUT. Accordingly, the output impedance of the dummy output circuit 501 and the data output circuit 100 can be promptly adjusted so as to match the characteristic impedance of the transmission line 12.

Figure 14:
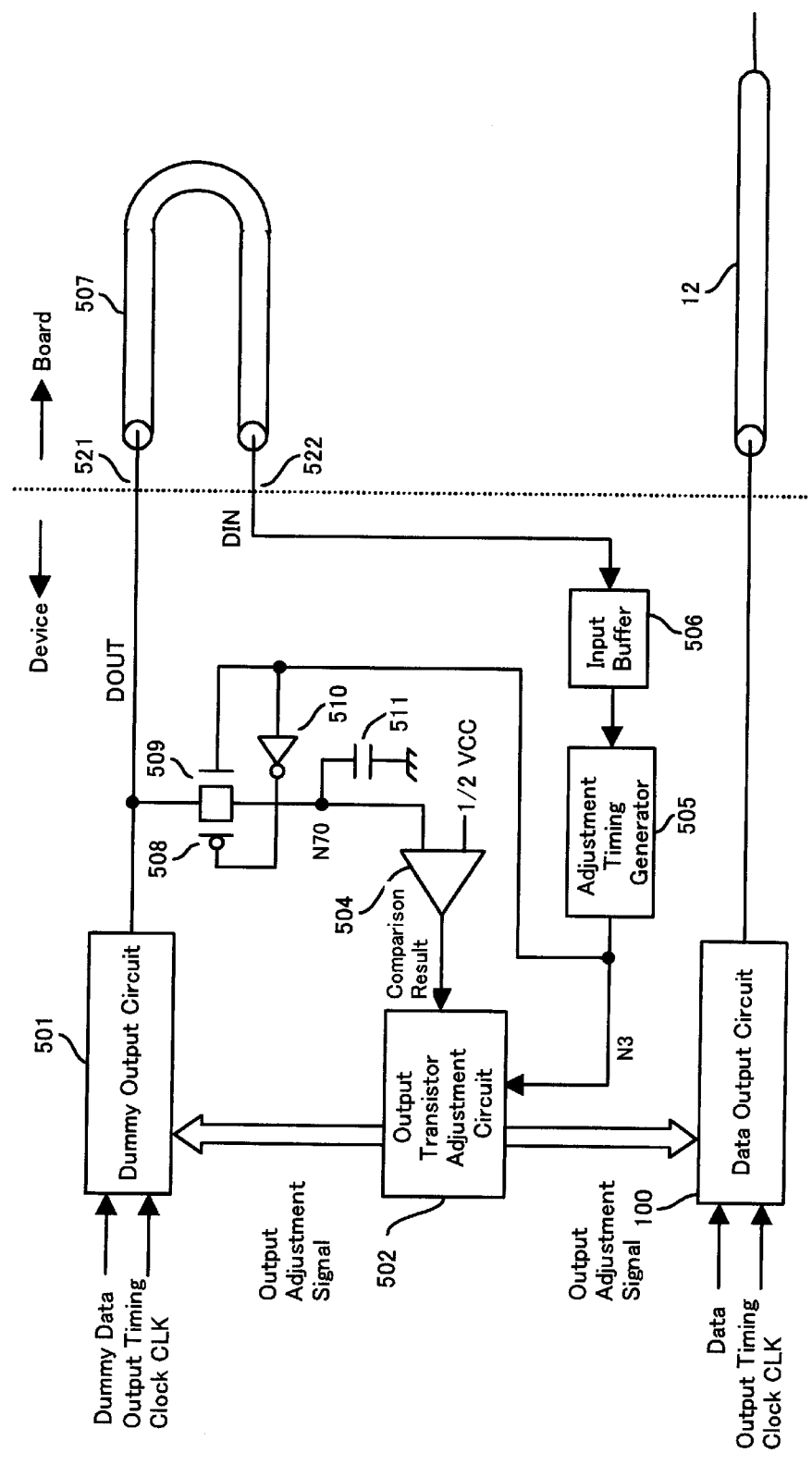
FIG. 14 shows the configuration of an LSI device according to a third embodiment of the present invention.

FIG. 14 is a configuration diagram of the LSI device according to a third embodiment of the present invention.

According to this embodiment, in the same manner as in the second embodiment, the output impedance of the dummy output circuit 501 is adjusted by use of the dummy output circuit 501 and the dummy transmission line 507, and simultaneously the output impedance of the data output circuit 100 is adjusted.

This embodiment has a substantially same configuration as in the second embodiment. However, the signal level of the intermediate step part of the output signal DOUT is sampled by a sampling circuit configured by a PMOS transistor 508, an NMOS transistor 509, an inverter 510, and a sampling capacitor 511. The sampling value N70 is compared with a reference voltage, ½ Vcc, by the comparator 504, and the output impedance of the dummy output circuit 501 and the data output circuit 100 is adjusted by the comparison results.

According to this embodiment, as the signal level of the intermediate step part of DOUT can be detected at a timing that a logic of a signal input into the input end 522 is switched, it is possible to easily detect the signal level of the intermediate step part of DOUT. Accordingly, it is possible to promptly adjust so that the output impedance of the dummy output circuit 501 and the data output circuit 100 is matched with the characteristic impedance of the transmission line 12.

Hereinafter, according to the present invention, as the transient voltage of the output terminal connected to the transmission line is detected, and the output impedance of the data output circuit is adjusted, even if manufacture processes, use temperatures, power supply voltages, characteristic impedance of the transmission line, or the like fluctuates or is changed, the output impedance of the data output circuit can be adjusted so as to match the characteristic impedance of the transmission line.

The protection scope of the present invention is not limited to the embodiments, but extends the invention described in the claim for a patent, and the equivalents.

What is claimed is:

1. An LSI device having an output terminal outputting a data, comprising:
   a data output circuit connected to the output terminal and capable of adjusting an output impedance thereof; and
   an adjustment circuit which, in a condition that a transmission line not terminated by a terminating resistor is connected to the output terminal, and when an output logic of the data output circuit is switched, detects a transient timing when a voltage at the output terminal reaches to a transient voltage, detects the transient voltage at the detected transient timing, compares the transient voltage with a reference voltage, and adjusts the output impedance of the data output circuit so as to match a characteristic impedance of the transmission line.

2. An LSI device according to claim 1, wherein
   the transient voltage is generated in a period from an output from the output terminal of an output signal of the data output circuit till a return of the output signal to the output terminal as a result of reflection at a terminal end of the transmission line, the transient voltage being a voltage between a ground level and an amplitude level of the output signal.

3. An LSI device according to claim 1, wherein
   the data output circuit includes a plurality of transistors connected in parallel with one another, and wherein
   the adjustment circuit selectively activates the plurality of transistors to adjust the output impedance of the data output circuit.

4. An LSI device according to claim 1, wherein
   the adjustment circuit detects the transient timing by sampling the voltage at the output terminal within a predetermined time difference and detecting the sampled voltages being the same level.

5. An LSI device having an output terminal outputting a data, a dummy output terminal outputting a dummy data, and a dummy input terminal which accepts the dummy data through a dummy transmission line, the LSI device comprising:
   a data output circuit connected to the output terminal and capable of adjusting an output impedance thereof;
   a dummy output circuit connected to the dummy output terminal and having a configuration equivalent to that of the data output circuit; and
   an adjustment circuit which detects a transient voltage at the dummy output terminal when an output logic of the dummy data output circuit is switched in a condition that the dummy transmission line is connected between the dummy output terminal and the dummy input terminal, compares the transient voltage with a reference voltage, and adjusts the output impedance of the data output circuit and of the dummy output circuit so as to match a characteristic impedance of the dummy transmission line.

6. An LSI device according to claim 5, wherein
   the transient voltage is detected at a timing when a logic of a signal fed to the dummy input terminal is switched at the dummy input terminal, the transient voltage being a voltage between a ground level and an amplitude of the output signal.

7. An LSI device according to claim 5, wherein
   the data output circuit and the dummy output circuit each include a plurality of transistors connected in parallel with one another, and wherein
   the adjustment circuit selectively activates the plurality of transistors to adjust the output impedance of the data output circuit and of the dummy output circuit.

8. An LSI device according to claim 5, wherein
   the dummy transmission line has a signal delay time substantially equal to that of the transmission line connected to the output terminal.

* * * * *